United States Patent
Reinhold

(10) Patent No.: US 9,672,794 B2
(45) Date of Patent: Jun. 6, 2017

(54) MEASURING DEVICE WITH A DISPLAY MEMORY HAVING MEMORY CELLS WITH A REDUCED NUMBER OF BITS AND A CORRESPONDING METHOD

(71) Applicant: Rohde & Schwarz GmbH & Co. KG, Munich (DE)

(72) Inventor: Michael Reinhold, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 66 days.

(21) Appl. No.: 14/661,568

(22) Filed: Mar. 18, 2015

(65) Prior Publication Data

US 2016/0063967 A1    Mar. 3, 2016

(30) Foreign Application Priority Data

Aug. 29, 2014   (EP) .................................... 14182759
Oct. 22, 2014   (EP) .................................... 14189843

(51) Int. Cl.
| | |
|---|---|
| G09G 5/393 | (2006.01) |
| G01R 13/02 | (2006.01) |
| G01R 13/22 | (2006.01) |
| G09G 3/20 | (2006.01) |
| G09G 5/00 | (2006.01) |

(Continued)

(52) U.S. Cl.
CPC ........... *G09G 5/393* (2013.01); *G01R 13/029* (2013.01); *G01R 13/0227* (2013.01); *G01R 13/22* (2013.01); *G09G 3/2003* (2013.01); *G09G 5/001* (2013.01); *G09G 5/06* (2013.01); *G09G 5/395* (2013.01); *G09G 2330/021* (2013.01)

(58) Field of Classification Search
None
See application file for complete search history.

(56) References Cited

U.S. PATENT DOCUMENTS 5,434,954 A * 7/1995 Kawauchi ............ G01R 13/345
                                                        345/440
5,550,963 A * 8/1996 Siegel .................. G01R 13/345
                                                        345/440

(Continued)

*Primary Examiner* — Sultana M Zalalee
(74) *Attorney, Agent, or Firm* — Ditthavong & Steiner, P.C.

(57) ABSTRACT

A method for reducing a number of bits used for a frequency value of a measuring signal stored in each memory cell of a display memory in a measuring device determines the frequency value in each memory cell by assigning the frequency of sampled values in several measuring portions of a measured signal within an update cycle of the display to a corresponding memory cell. It then displays each pixel of the display with a brightness or a color corresponding to the frequency value in the corresponding memory cell after each update cycle. The determined frequency value is a sum of a first frequency value, which is determined in a number of first measuring portions of the measured signal within the update cycle, and at least one compressed second frequency value, which is determined by compression of a corresponding compressed second frequency value with a compression factor. Each uncompressed second frequency value can be determined in a corresponding part of a number of second measuring portions of the measured signal within the update cycle.

12 Claims, 5 Drawing Sheets

(51) Int. Cl.
*G09G 5/06* (2006.01)
*G09G 5/395* (2006.01)

(56) References Cited

U.S. PATENT DOCUMENTS

| | | | | |
|---|---|---|---|---|
| 5,929,842 | A * | 7/1999 | Vertregt | G01R 13/02 345/690 |
| 6,057,853 | A * | 5/2000 | Siegel | G01R 13/345 345/600 |
| 6,151,010 | A * | 11/2000 | Miller | G01R 13/02 345/440.1 |
| 6,163,758 | A * | 12/2000 | Sullivan | G01R 13/0263 345/440.1 |
| 6,374,189 | B1 * | 4/2002 | Sasai | G01R 23/165 324/76.19 |
| 8,203,619 | B2 * | 6/2012 | Cho | H04N 19/176 348/222.1 |
| 2003/0152266 | A1 * | 8/2003 | Ivers | G01R 13/0218 382/169 |
| 2007/0047646 | A1 * | 3/2007 | Koh | H04N 19/172 375/240.03 |
| 2008/0123886 | A1 * | 5/2008 | Andersen | H04R 25/353 381/320 |
| 2008/0218585 | A1 * | 9/2008 | Wagner | H04N 5/262 348/14.09 |
| 2009/0309879 | A1 | 12/2009 | Gorbics | |

* cited by examiner

MEASURING DEVICE WITH A DISPLAY MEMORY HAVING MEMORY CELLS WITH A REDUCED NUMBER OF BITS AND A CORRESPONDING METHOD

FIELD OF THE INVENTION

The invention relates to a measuring device with a display memory having memory cells with a reduced number of bits for storing frequency values of a periodic measured signal to be displayed and a corresponding method.

BACKGROUND OF THE INVENTION

In modern measuring devices, especially in modern digital oscilloscopes, a huge number of periodic measuring portions of a signal to be measured and to be displayed per time unit are acquisitioned. In future digital oscilloscopes about 1,000,000 acquisitions per second are determined. Thus updating the display in a period of 30 milliseconds leads to about 33,000 acquisitions per update cycle to be handled in a display memory of the oscilloscope.

A modern measuring device has to offer the two following display features to a user:

A histogram showing the statistical distribution of the sampled values of the measuring signal over all the acquisitions within an update cycle: The brightness or the color of each pixel enables the user to recognize, how many sampled values of the measured signal over all the acquisitions within an update cycle falls within the sampled value range and the time point resp. the frequency bin of the corresponding pixel as shown in FIG. 1. This feature for example enables the display of the noise behavior of the measured signal;

a display of a rare or singular occurrence of a sampled value within the sampled value range and the time point resp. the frequency bin of the corresponding pixel: This feature, for example, enables the display of a sporadic anomaly—i.e. a spike—in the measured signal.

If 135,000 acquisitions are measured in an update cycle, one single pixel per column of the display can be hit 135,000 times in an update cycle in the worst case. Taking into account this worst case, each memory cell in the display memory assigned to a specific pixel of the display has to store a data of ld(33,000)=16 bits. Thus, in case of a display memory with 1250×800 memory cells, a memory capacity of 16 MBits for each display memory is necessary, i.e. applying 4 display memories the total size is 64 MBit. Using an ASIC for implementing such a display memory disadvantageously results in a comparatively too large portion of the total chip area for memory purpose (for example more than 50% of the total chip area).

In US 2009/0309879 A1 the number of bits in each memory cell of a display memory is reduced by decreasing the probability of incrementation of the frequency value stored in a memory cell in case of a hit of the corresponding pixel by a measured sampled value in dependency of the size of the frequency value actually stored in the memory cell.

The histogram of the measuring signal determined in US 2009/0309879 A1 does disadvantageously not represent the original statistical distribution of the measuring signal, because lower frequency values are taken into account in the histogram with a comparatively higher weighting than higher frequency values.

Therefore, one object is develop a measuring device, a corresponding method and a respective computer program with a reduced number of bits in each memory cell of the display memory enabling a more realistic representation of the statistical distribution of the measured signal in the display.

SUMMARY OF THE INVENTION

Each occurrence of a sampled value of a measuring signal in all periodic measuring portions of the measured signal within an update cycle of the display within the sampled value range and a time point—in case of a time domain measuring device—resp. a frequency bin—in case of a frequency domain measuring device—corresponds to a specific pixel of the display results in an increment of the frequency value of the corresponding memory cell of the display memory.

After each update cycle the frequency value actually stored in each memory cell of the display memory is displayed in a corresponding brightness or in a corresponding color in a pixel of the display corresponding to the memory cell.

Each memory cell of the display memory has a reduced number of bits and stores a sum of a first frequency value, which is determined in a number of first measuring portions of the measured signal within an update cycle of the display, and at least one compressed second frequency value, which is determined by compression of a corresponding uncompressed second frequency value by a compression factor.

Preferably, each uncompressed second frequency value and respectively each compressed second frequency value is determined in a corresponding part of a number of second measuring portions of the measured signal within an update cycle of the display.

By the use of a first frequency value in each memory cell, a display of the statistical distribution of the sampled values of the measured signal is possible, whereas by the use of at least one compressed second frequency value in each memory cell a rare or singular occurrence of a sampled value—i.e. a spike—of the measured signal within the sampled value range and the time point resp. the frequency bin of a specific pixel in the display can be displayed.

Furthermore, a good use of the reduced number of bits in each memory cell of the display memory can be advantageously gained by the use of the sum of the first frequency value and the at least one second frequency value in each memory cell. Summing the first frequency value and the at least one compressed second frequency value in each memory cell having a reduced number of bits advantageously enables the simultaneous display both of the statistical distribution of the sampled values of the measured signal and of sporadic anomalies in the sampled values of the measured signal.

The compression factor for compressing each uncompressed second frequency value to a compressed second frequency value is preferably adapted to generate a compressed second frequency value having the value one or zero.

Normally, the compression factor used for compressing the uncompressed second frequency value in each memory cell is preferably identical for each compressed second frequency value.

In a first preferred embodiment of the invention the first frequency value is determined in all consecutive first measuring portions of the measured signal of an update cycle, whereas the at least one second frequency value is determined in all consecutive second measuring portions of the measured signal of an update cycle of the display. All consecutive first measuring portions of the measured signal are disposed in a cyclic change with all consecutive second measuring portions of the measured signal. If the statistical distribution of the sampled values of the measuring signal is approximately time invariant, the first embodiment of the invention delivers a statistical distribution, which approximates the realistic statistical distribution rather well.

In a preferred case of the first embodiment of the invention, the number of consecutive first measuring portions of the measured signal corresponds to the first frequency value of the first frequency values in all memory cells, which reaches firstly the value two, which is powered with the reduced number of bits, minus the value one minus the summed sampled values in all memory cells of a column of the display within one update cycle and minus the quotient between the number of second measuring portions and the compression factor.

In a second preferred embodiment and in a third preferred embodiment of the invention the determination of at least one uncompressed second frequency value in second measuring portions of the measured signal is distributed over the determination of the first frequency value in first measuring portions of the measured signal. Thus, a time variant statistical distribution of the measured signal can be more realistically displayed in the second embodiment and in the third embodiment of the invention.

In the second embodiment of the invention, uncompressed second frequency values are preferably determined in a number of second measuring portions of the measured signal, which corresponds to the value of the compression factor, and one compressed second frequency value is determined by compression from these uncompressed second frequency values with the compression factor. Each compressed second frequency value is determined in a cyclic change with a part of the first frequency value determined in a part of the first measuring portions of the measured signal, which corresponds to the quotient between the number of all the first measuring portions and the number of compressed second frequency values within one update cycle.

In the third embodiment of the invention the determination of each compressed second frequency value within one update cycle is preferably distributed in equal distance to each other between first measuring portions of one update cycle, in which parts of the first frequency value are determined.

The number of first measuring portions and the number of second measuring portions are preferably determined after at least one update cycle.

The number of first measuring portions is preferably increased in at least one update cycle, if the determined maximum first frequency value of the first frequency values in all memory cells of the display memory is smaller than the number of the actual first measuring portions which corresponds to the number of bits in each cell of the display memory assigned for storing a maximum occurring first frequency value.

The increased number of first measuring portions preferably corresponds to the actual number of the first measuring portions multiplied by the quotient between the actual number of the first measuring portions and the determined maximum first frequency value of the first frequency values in all memory cells of the display memory.

The number of first measuring portions is preferably decreased in at least one update cycle, if the determined maximum first frequency value of the first frequency values in all memory cells of the display memory reaches a specific limit value.

The limit value preferably corresponds to the value two, which is powered with the reduced number of bits, minus the summed sampled values in all memory cells of a column of the display within one update cycle minus an integer quotient between the number of second measuring portions of the measuring signal within one update cycle and the compression factor.

The decreased number of the first measuring portions preferably corresponds to the determined maximum first frequency value of the first frequency values in all memory cells, which reaches the limit value.

If the quotient between the number of the second measuring portions within one update cycle and the compression factor—in the step of determining the limit value—results in a modulus, the modulus is preferably avoided by increasing equally both the compression factor and the number of the second measuring portions to be compressed in the latest compression within one update cycle with the compression factor.

If the number of measuring portions of the measured signal per update cycle changes, preferably the following changes in the values of the parameters second measuring portions and/or compression factor have to be performed:

If the number of measuring portions of the measured signal per update cycle increases, the number of first measuring portions within one update cycle remains constant and the number of second measuring portions to be compressed in the latest compression with the compression factor within the actual update cycle is increased for realizing a constant number of compressed second measuring portions within all the update cycles.

In the next update cycle the compression factor is increased for realizing a constant number of compressed second measuring portions within all the update cycles.

If the number of measuring portions of the measured signal per update cycle decreases, the number of first measuring portions within one update cycle remains constant and the number of second measuring portions within the actual update cycle decreases. The second frequency values for each memory cell are determined in the decreased number of second measuring portions within the actual update cycle.

In the next update cycle the compression factor is decreased for realizing a constant number of compressed second measuring portions within all the update cycles.

BRIEF DESCRIPTION OF THE DRAWINGS

Embodiments of the inventive measuring device and the inventive method are described in detail in the following on the basis of the drawings by way of example only. The figures of the drawing show.

DETAILED DESCRIPTION OF THE DRAWINGS

Figure 1:
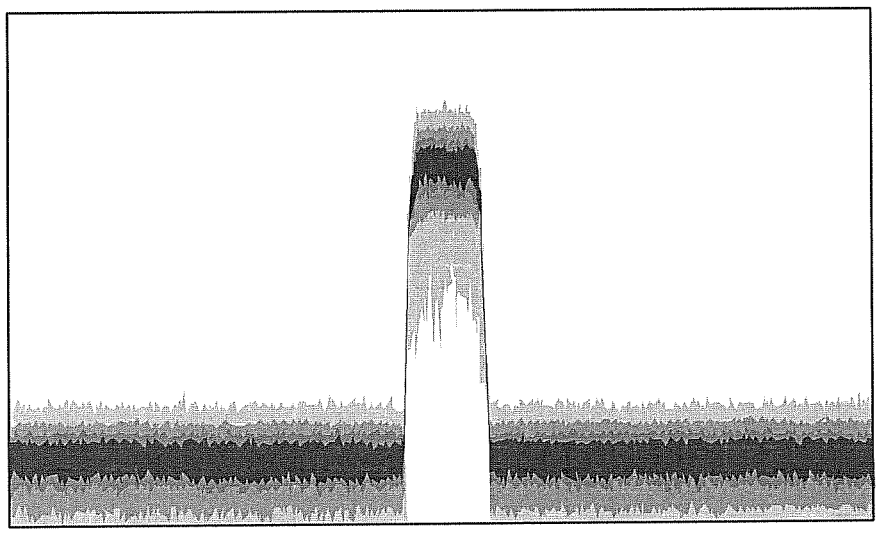
FIG. 1 a display diagram with pixels, whose colors correspond to the frequency values of a histogram of a measured signal, FIG. 2 a time diagram with the sampled values in each first and second measuring portion of the measured signal according to the first embodiment of the invention, FIG. 3 a time diagram with the sampled values in each first and second measuring portion of the measured according to the second embodiment of the invention, FIG. 4 a time diagram with the sampled values in each first and second measuring portion of the measured signal according to the third embodiment of the invention, FIG. 5 a block diagram of an embodiment of the inventive measurement device with a display memory having memory cells with a reduced number of bits for storing frequency values of a measured signal, FIG. 6A a flow chart of a first embodiment of the inventive method for reducing a number of bits used for a frequency value of a measured signal stored in each memory cell of a display memory in a measuring device, FIG. 6B a flow chart of a second embodiment of the inventive method for reducing a number of bits used for a frequency value of a measured signal stored in each memory cell of a display memory in a measuring device and FIG. 6C a flow chart of a third embodiment of the inventive method for reducing a number of bits used for a frequency value of a measured signal stored in each memory cell of a display memory in a measuring device.

The mathematical basics, which are necessary for the understanding of the invention, are explained in detail in the following.

Within one update cycle of the display in total $N_{Ges}$ measuring portions of a measured signal are acquisitioned, whereby each measuring portion contains at least one approximately similar measuring curve of the periodic measured signal, i.e. a time dependent measuring curve of the periodic measured signal in case of a time domain measuring device and a frequency dependent spectrum of the periodic measured signal in case of a frequency domain measuring device. The in total $N_{Ges}$ measuring portions comprise according to equation (1) $N_{unkomp}$ first measuring portions, in which a first frequency value of the sampled values of the measured signal for each memory cell of the display memory is determined, and $N_{komp}$ second measuring portions, in which at least one second frequency value of the sampled values of the measured signal for each memory cell of the display memory is determined.

$$N_{Ges} = N_{unkomp} + N_{komp} \quad (1)$$

In a special case, the measuring curve in each measuring portion of the measured signal within one update cycle is identical—i.e. a measured signal without any added noise and without any added sporadic interference signals—resulting in a maximum frequency value in memory cells of the display memory, which correspond to only one pixel within each column in the pixel raster of the display. In this worst case such a memory cell needs a high number of bits for storing the maximum frequency value.

Consequently, the first frequency value in such a memory cell can reach in the worst case the maximum value $$N_{unkomp} \cdot \frac{Reclength}{N_{Col}},$$

whereby Reclength represents the number of samples within one measuring portion and $N_{Col}$ represents the number of columns in the display and consequently $$\frac{Reclength}{N_{Col}}$$

represents the number of sampled values of the measured signal in one column within one measuring portion.

The at least one compressed second frequency value determined for a memory cell of the display memory can be determined by the quotient between the uncompressed second frequency value determined for the corresponding memory cell and the compression factor $P_{Kompres}$. In the worst case, the maximum uncompressed second frequency value determined for a memory cell occurs, if in all $N_{komp}$ second measuring portions of the measured signal within one update cycle a sampled value of the measured signal hit the sampled value range and the time point resp. the frequency bin of the pixel corresponding to the memory cell.

Consequently, according to equation (2) in the worst case, the sum of the maximum first frequency value and the at least one maximum second frequency value stored in one memory cell of the display memory has to be smaller than a value, which can be represented by a data stored in the memory cell and having $N_{Bits}$ bits.

$$N_{unkomp} \cdot \frac{Reclength}{N_{Col}} + \frac{N_{komp}}{P_{Kompres}} < 2^{N_{Bits}} \quad (2)$$

In dependency of the given parameters—data length in bits $N_{Bits}$ of each memory cell in the display memory, number $N_{Col}$ of columns in the display, number Reclength of sampled values of the measured signal within one measuring portion of the measured signal, total number $N_{Ges}$ of measuring portions within one update cycle—the number $N_{unkomp}$ of first measuring portions of the measured signal, the number $N_{komp}$ of second measuring portions of the measured signal and the compression factor $P_{Kompres}$ has to be appropriately parameterized in order to fulfill equations (1) and (2).

Simulation studies for the used application have shown that the quotient between the number $N_{komp}$ of second measuring portions and the compression factor $P_{Kompres}$ has to have optimally the value 10 according to equation (3) for realizing a realistic image of the statistical distribution of the measured signal.

$$\frac{N_{komp}}{P_{Kompres}} = 10 \quad (3)$$

For other applications a different value for the quotient could be optimal. To simplify the notation in the following the value 10 is used. Otherwise another value x can be applied.

Thus the second frequency value determined in $P_{Kompres}$ consecutive second measuring portions has to be compressed in one compression with the compression factor $P_{Kompres}$ to a compressed second frequency value of one or zero. Consequently, in total 10 compressions have to be performed to determine 10 second compressed frequency values from the $10 \cdot P_{Kompres}$ second frequency values determined in $N_{komp}$ second measuring portions of the measured signal.

Taking into account equations (1) to (3) it is thus only necessary to determine the number $N_{unkomp}$ of first measuring portions of the measured signal once within each update cycle or once within multiple update cycles. The number $N_{komp}$ of second measuring portions of the measured signal and the compression factor $P_{Kompres}$ can be derived from the determined number $N_{unkomp}$ of first measuring portions of the measured signal using equations (1) and (3).

The number $N_{unkomp}$ of first measuring portions of the measured signal and consequently the number $N_{komp}$ of second measuring portions of the measured signal and the compression factor $P_{Kompres}$ has to be adaptively determined in step of one update cycle or multiple update cycles on the basis of the frequency values determined in the actual or in the last update cycle.

If the total number $N_{Ges}$ of measuring portions of the measured signal within each update cycle remains constant, the parameters $N_{unkomp}$, $N_{komp}$ and $P_{Kompres}$ have to be determined, as follows:

An increase of the number $N_{unkomp}$ of first measuring portions of the measured signal has to be performed in the actual update cycle, if the maximum first frequency value determined for all the memory cells of the display memory in the actual update cycle is significantly smaller than the number of first measuring portions, in which the first frequency values for all the memory cells are determined. The number of first measuring portions in the actual update cycle corresponds to the number of bits in each cell of the display memory assigned for storing a maximum occurring first frequency value.

In this case the statistical distribution of the measured signal characterized by the determined first frequency values does not appropriately represent the realistic statistical distribution of the measured signal, because the most part of the frequency values occurs in the second measuring portions of the measured signal and is lost as result of the compression of the second frequency values in the second measuring portions.

The new number $N_{unkomp\_neu\_Inc}$ of first measuring portions of the measured signal for the next update cycle is determined according to equation (4) by weighting the actual number $N_{unkomp}$ of first measuring portions of the measured signal with the quotient between the actual number $N_{unkomp}$ of first measuring portions of the measured signal and the first maximum frequency value $N_{First\_Max}$ determined for all memory cells in the actual update cycle.

$$N_{unkomp\_neu\_Inc} = N_{unkomp} \cdot \frac{2^{N_{Bits}} - 10}{N_{First\_Max}} \quad (4)$$

According to equation (5) the first maximum frequency value $N_{First\_Max}$ corresponds approximately to the difference between the determined maximum summed frequency value $N_{Sum\_Max}$ and the maximum second frequency value $N_{Second\_Max}$. Hereby the maximum second frequency value $N_{Second\_Max}$ can be approximated by the fact, that each compressed second frequency value for one memory cell in one update cycle has the value one, which can be modeled by the number of compressions of the at least one uncompressed second frequency values and corresponds to the quotient between the number $N_{komp}$ of second measuring portions and the compression factor $P_{Kompres}$.

$$N_{First\_Max} = N_{Sum\_Max} - N_{Second\_Max} = N_{Sum\_Max} - \frac{N_{komp}}{P_{Kompres}} \quad (5)$$

The new number $N_{komp\_neu\_Inc}$ of second measuring portions of the measured signal can be determined from the determined new number $N_{unkomp\_neu\_Inc}$ of first measuring portions of the measured signal according to equation (6), which is derived from equation (1).

$$N_{komp\_neu\_Inc} = N_{Ges} - N_{unkomp\_neu\_Inc} \quad (6)$$

The new compression factor $P_{Kompres\_Neu\_Inc}$ can be determined from the new number $N_{komp\_neu\_Inc}$ of second measuring portions of the measured signal according to equation (7), which is derived from equation (3).

$$P_{Kompres\_Neu\_Inc} = \frac{N_{komp\_Neu\_Inc}}{10} \quad (7)$$

Preferably, the new number $N_{komp\_neu\_Inc}$ of first measuring portions of the measured signal has to be reduced by an appropriately selected tolerance value $\Delta_{unkomp\_neu}$ for avoiding an overflow in the memory cell in case of statistical deviation of the sampled values of the measured signal.

A decrease of the number $N_{unkomp}$ of first measuring portions of the measured signal has to be performed in the actual update cycle, if the determined maximum first frequency value over all memory cells of the display memory reaches a specific limit value $N_{First\_Limit}$, which is reserved for the storage of a first frequency value in a memory cell of the display memory. This limit value $N_{First\_Limit}$ can be derived from equation (2), if in each first measuring portion of the in total $N_{unkomp}$ first measuring portions of the measured signal within one update cycle the first frequency value is incremented in the corresponding memory cell, and can be determined according to equation (8).

$$N_{First\_Limit} < (2^{N_{Bits}} - 10) \cdot \frac{N_{Col}}{Reclength} \quad (8)$$

In equation (8) a quotient between the number $N_{komp}$ of second measuring portions and the compression factor $P_{Kompres}$ having the optimal value 10 according to equation (3) is taken into account. If another integer value x for the quotient between the number $N_{komp}$ of second measuring portions and the compression factor $P_{Kompres}$ is used, the value 10 is to be substituted by the value x in equation (8).

If a first frequency value in one of the memory cells reaches the limit value $N_{First\_Limit}$ according to equation (8), the number of already within the actual update cycle treated first frequency measuring portions of the measured signal is frozen as new decreased number $N_{unkmp\_neu\_Dec}$ of first measuring portions of the measured signal. The remaining first frequency measuring portions of the measured signal of the update cycle are not considered anymore for the determination of the actual first frequency values. A new decreased number $N_{unkmp\_neu\_Dec}$ of first measuring portions of the measured signal will result in an increased number $N_{kmp\_neu\_Dec}$ of second measuring portions of the measured signal according to equation (9), if the total number $N_{Ges}$ of measuring portions within one update cycle remains constant.

$$N_{kmp\_neu\_Dec} = N_{unkmp\_neu\_Dec} \quad (9)$$

The new decreased compression factor $P_{Kompres\_neu\_Dec}$ can be determined from the new decreased number $N_{kmp\_neu\_Dec}$ of second measuring portions of the measured signal according to equation (10), which is derived from equation (9).

$$P_{Kompres\_neu\_Dec} = \frac{N_{komp\_neu\_Dec}}{10} \quad (10)$$

The increase in the new number $N_{kmp\_neu\_Dec}$ of second measuring portions of the measured signal can perhaps lead to a new compression factor $P_{Kompres\_neu\_Dec}$ having a fractional part according to equation (10). In this case 9 compressions are performed with the integer part of the determined new compression factor $P_{Kompres\_neu\_Dec}$ and the last compression is performed with a new compression factor $P_{Kompres\_neu\_Dec}$ having an increased value in comparison to the new compression factor $P_{Kompres\_neu\_Dec}$ according to equation (10). Thus the number of compressions for the compression of the at least one uncompressed second frequency values to the corresponding at least one compressed second frequency values—i.e. optimally the value 10 or another selected value x for the quotient $$\frac{N_{komp\_neu\_Dec}}{P_{Kompres\_neu\_Dec}}$$

remains constant.

If the total number $N_{Ges}$ of measuring portions of the measured signal changes between the update cycles, the parameters $N_{unkomp}$, $N_{komp}$ and $P_{Kompres}$ have to be determined, as follows:

The change of the total number $N_{Ges}$ of measuring portions of the measured signal does not influence the number $N_{unkomp}$ of first measuring portions of the measured signal.

In case of an increase of the total number $N_{Ges}$ of measuring portions of the measured signal more than $P_{Kompres}$ second measuring portions of the measured signal—i.e. $P_{Kompres}$ second measuring portions plus the difference between the total number $N_{Ges\_Akt}$ of measuring portions in the actual update cycle and the total number $N_{Ges\_Letzt}$ of measuring portions in the last update cycle—are taken into account in the last compression with the compression factor $P_{Kompres}$.

In the next update cycle the compression factor $P_{Kompres}$ is incremented according to equation (11A) or alternatively according to equation (11B):

$$P_{Kompres} = \frac{N_{komp} + N_{Ges\_Akt} - N_{Ges\_Letzt}}{10} \quad (11A)$$

$$P_{Kompres} = \frac{N_{Ges\_Akt} - N_{unkomp}}{10} \quad (11B)$$

In case of a decrease of the total number $N_{Ges}$ of measuring portions of the measured signal less than $P_{Kompres}$ second measuring portions of the measured signal—i.e. $P_{Kompres}$ second measuring portions minus the difference between the total number $N_{Ges\_Letzt}$ of measuring portions in the last update cycle and the total number $N_{Ges\_Akt}$ of measuring portions in the actual update cycle—are taken into account in the last compression or in the last compressions with the compression factor $P_{Kompres}$.

In the next update cycle the compression factor $P_{Kompres}$ is decremented according to equation (12A) or alternatively according to equation (12B):

$$P_{Kompres} = \frac{N_{komp} - (N_{Ges\_Letzt} - N_{Ges\_Akt})}{10} \quad (12A)$$

$$P_{Kompres} = \frac{N_{Ges\_Akt} - N_{unkomp}}{10} \quad (12B)$$

The determination of the frequency value and the at least one second frequency value, which are stored in each memory cell of the display memory for an update of the corresponding pixel in the display in the following update cycle, can be performed in different timing schemes according to the three embodiments of the invention.

In the first embodiment of the invention the first frequency value for each memory cell is determined in all $N_{unkomp}$ consecutive first measuring portions of the measured signal, whereas the at least one second frequency value for each memory cell is determined in all $N_{komp}$ consecutive second measuring portions of the measured signal. The $N_{unkomp}$ consecutive first measuring portions are disposed in cyclic change with the $N_{komp}$ consecutive second measuring portions.

A first frequency value for a memory cell can be determined in one of the first measuring portions of the measured signal, until the counted number $N_{Count}$ of measuring portions of the measured signal within the actual update cycle does not reach the value according to equation (13), which is derived from equation (3).

$$N_{Count} = \left(2^{N_{Bits}} - \frac{N_{komp}}{P_{Kompres}}\right) \cdot \frac{N_{Col}}{Reclength} \quad (13)$$

In the second embodiment of the invention each second frequency value for each memory cell is determined in the corresponding $P_{Kompres}$ consecutive second measuring portions of the measured signal, all of which are disposed in equal distance and separated by a reduced number $\tilde{N}_{unkomp}$ of consecutive first measuring portions of the measured signal to the next $N_{Kompres}$ consecutive second measuring portions of the measured signal resp. to the last $P_{Kompres}$ consecutive second measuring portions of the measured signal. In the reduced number $\tilde{N}_{unkomp}$ of consecutive first measuring portions of the measured signal a part of the first frequency value is determined. The reduced number $\tilde{N}_{unkomp}$ of consecutive first measuring portions of the measured signal corresponds according to equation (14) to the quotient between the total number $N_{unkomp}$ of first frequency measuring portions of the measured signal and the number of compressions within one update cycle resp. the number of compressed second frequency values. The number of compressions within one update cycle resp. the number of compressed second frequency values within one update cycle corresponds to the quotient between the number $N_{komp}$ of second measuring portions and the compression factor $P_{Kompres}$.

$$\tilde{N}_{unkomp} = N_{unkomp} / \left(\frac{N_{komp}}{P_{Kompres}}\right) \quad (14)$$

Each compressed second frequency value is determined by compression of the corresponding "uncompressed" second frequency value determined in $P_{Kompres}$ consecutive second measuring portions with the compression factor $P_{Kompres}$ and results in a compressed second frequency value of one or zero.

In the third embodiment of the invention each "uncompressed" second frequency value is determined in $P_{Kompres}$ second measuring portions of the measured signal within one update cycle, whereby the first frequency value is determined in a reduced number $\tilde{N}_{unkomp}$ of first measuring portions of the measured signal according to equation (13). Both the $P_{Kompres}$ second measuring portions of the measured signal are not necessarily consecutively disposed to each other and the reduced number $\tilde{N}_{unkomp}$ of first measuring portions of the measured signal are not necessarily consecutively disposed to each other. All the reduced numbered $\tilde{N}_{unkomp}$ of first measuring portions of the measured signal are disposed between the $P_{Kompres}$ second measuring portions of the measured signal in such a way, that the determination of each "compressed" second frequency value is distanced from the determination of the neighbored "compressed" second frequency value by an equal number $N_{Abstand}$ of measuring portions. This number $N_{Abstand}$ of measuring portions corresponds according to equation (15) to the sum of the reduced number $\tilde{N}_{unkomp}$ of first measuring portions of the measured signal for determining a first frequency value and the number $P_{Kompres}$ of second measuring portions of the measured signal for determining one second frequency value.

$$N_{Abstand} = \tilde{N}_{unkomp} + P_{Kompres} \quad (15)$$

In the following the three embodiments of inventive method for reducing a number of bits used for a frequency value of a measuring signal stored in each memory cell of a display memory in a measuring device is explained in detail on the basis of the flowcharts shown in FIG. 6A to 6C and the inventive measuring device for performing that inventive method is explained in detail on the basis of the block diagram shown in FIG. 5.

Figure 6A:
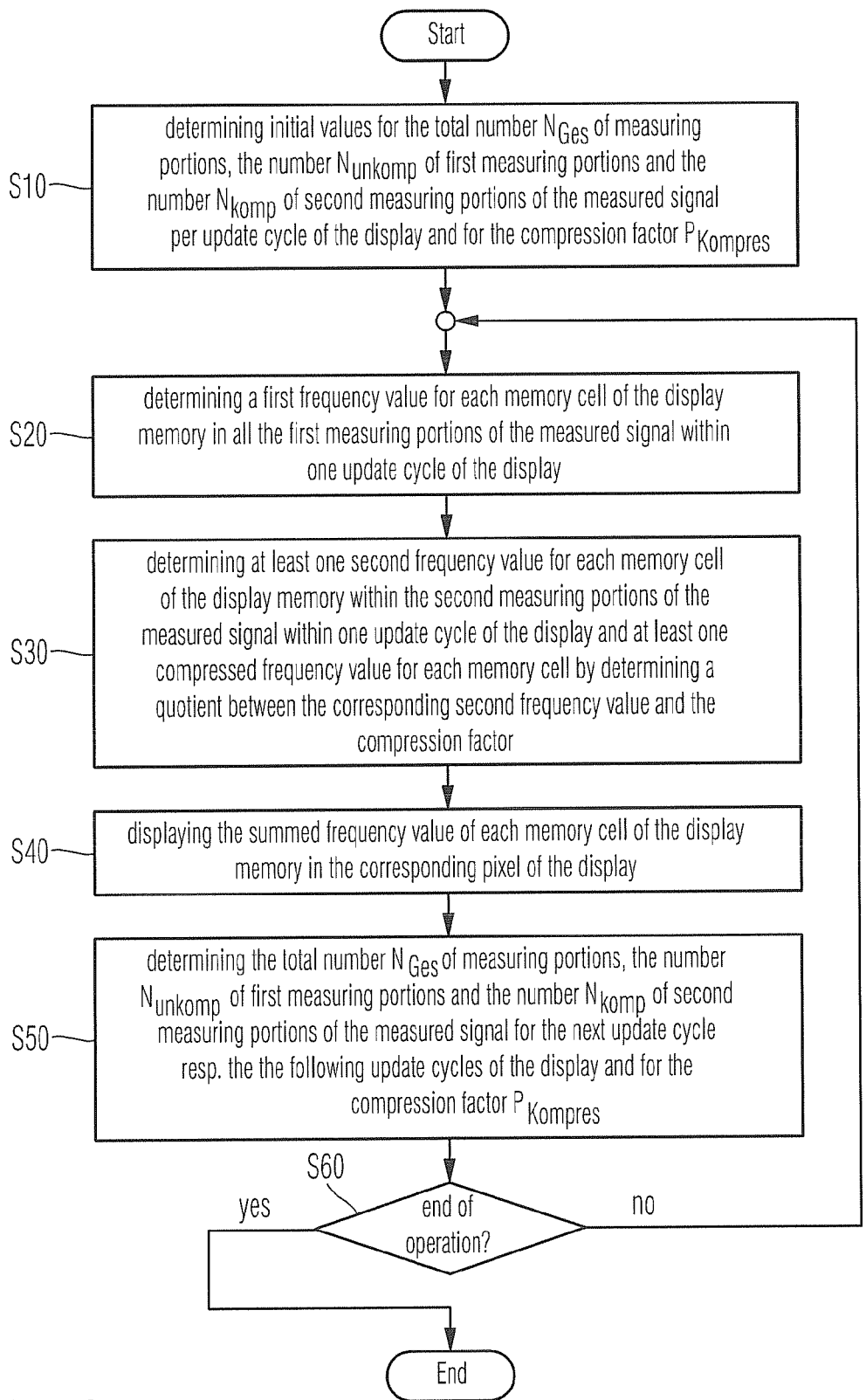

In the first method step S10 in FIG. 6A of the first embodiment of the inventive method appropriate initial values for the total number $N_{Ges}$ of measuring portions of the measured signal within one update cycle, for the number $N_{unkomp}$ of first measuring portions of the measured signal for determining a first frequency value for each memory cell of the display memory 2, for the number $N_{komp}$ of second measuring portions of the measured signal for determining at least one second frequency value for each memory cell of the display memory 2 and for the compression factor $P_{Kompres}$ are selected.

Figure 5:
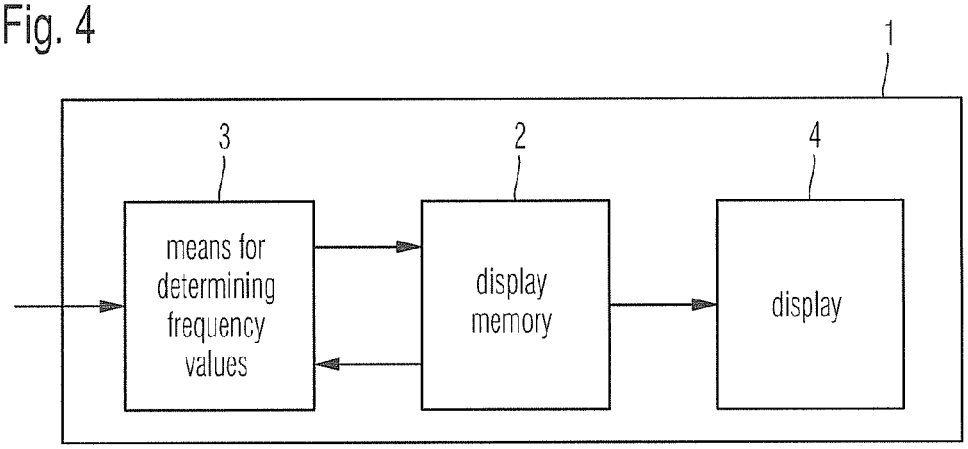

For different values of signal parameters of a measured signal like frequency, amplitude, signal to noise ratio and for the used parameters RecLength, $N_{Col}$ and $N_{Bits}$ of the inventive measuring device 1 optimized initial values for the parameters $N_{Ges}$, $N_{uncomp}$, $N_{komp}$ and $P_{Kompres}$ are determined and stored in a data base in the inventive measuring device 1 from the producer of the inventive measuring device 1 shown in FIG. 5. In a prephase, the signal parameters of the measured signal—frequency, amplitude and signal to noise ratio—are measured and are used in the determination of initial values for the parameters $N_{Ges}$, $N_{unkomp}$, $N_{comp}$ and $P_{Kompres}$.

In the next method step S20, a means 3 for determining frequency values determines a first frequency value for each memory cell of the display memory 2 in $N_{unkomp}$ consecutive first measuring portions of the measured values within one update cycle of the display 4 and stores the determined first frequency value in the corresponding memory cell of the display memory 2. Preferably, the first frequency value for a corresponding memory cell is incremented by the means 3 for determining frequency values in the corresponding memory each time, when the acquisitioned sampled value of the measured signal hit the amplitude value range and the time point resp. the frequency bin of the corresponding memory cell.

Alternatively the first frequency value corresponding to a memory cell of the display memory is incremented each time in a memory cell of a memory within the means 3 for determining frequency values, which is not shown in FIG. 5, and is transferred from this memory to the display memory 2 at the end of the update cycle.

In the next method step S30 a first inventive variant determines an "uncompressed" second frequency value corresponding to each memory cell of the display memory 2 in $P_{Kompres}$ consecutive second measuring portions of the measured signal. Each time, when a acquisitioned sampled value of the measured signal in one of the $P_{Kompres}$ consecutive second measuring portions hits the amplitude value range, the time point resp. the frequency bin corresponding to a memory cell of the display memory 2, a corresponding memory cell of a so called compression memory in the means 3 for determining frequency values, which is not shown in FIG. 5, is incremented. The "uncompressed" second frequency value for each memory cell determined at the end of $P_{Kompres}$ consecutive second measuring portions is compressed with the compression factor $P_{Kompres}$ to a corresponding "compressed" second frequency value having the value zero or one. The "compressed" second frequency value for each memory cell is summed to the corresponding first frequency value in the corresponding memory cell of the display memory 2 and each memory cell of the compression memory in the means 3 for determining frequency values is reset for a new determination of a further "uncompressed" second frequency value in further $P_{Kompres}$ consecutive second measuring portions.

The first inventive variant results in a higher number of bits in each memory cell of the compression memory for storing an uncompressed second frequency value. For reducing the number of bits in each memory cell of the compression memory to one bit a second inventive variant only increases the corresponding memory cell in the compression memory, if a acquisitioned sampled value of the measured signal in one of the $P_{Kompres}$ consecutive second measuring portions hits the amplitude value range, the time point resp. the frequency bin of the corresponding memory cell and the corresponding cell in the compression memory actually stores the value zero. After $P_{Kompres}$ consecutive second measuring portions the "compressed" second frequency value for each memory cell determined in this manner is summed to the corresponding first frequency value in the corresponding memory cell of the display memory 2 and each memory cell of the compression memory in the means 3 for determining frequency values is reset.

The third inventive variant uses the compression memory as bit map, whereby each memory cell of the bit map in the compression memory indicates if the corresponding memory cell in the display memory 2 is already incremented to the value one. If the corresponding memory cell in the bit map contains a value zero in case an acquisitioned sampled value of the measured signal in one of the $P_{Kompres}$ consecutive second measuring portions hits the amplitude value range, the time point resp. the frequency bin of the corresponding memory cell, the corresponding memory cell in the bit map in the compression memory is set and a value one is summed to the corresponding first frequency value in the corresponding memory cell of the display memory 2. Alternatively if the corresponding memory cell in the bit map contains a value one in case an acquisitioned sampled value of the measured signal in one of the $P_{Kompres}$ consecutive second measuring portions hits the amplitude value range, the time point resp. the frequency bin of the corresponding memory cell, the corresponding memory cell in the bit map in the compression memory remains set and the content in the corresponding memory cell in the display memory 2 remains. After consecutive second measuring portions each memory cell of the compression memory in the means 3 for determining frequency values is reset.

After in total $$\frac{N_{komp}}{P_{Kompres}}$$

determinations of a "uncompressed" second frequency value resp. of a "compressed" second frequency value for each memory cell of the display memory 2 in $N_{komp}$ consecutive second measuring portions of the measured signal and after in total $$\frac{N_{komp}}{P_{Kompres}}$$

summations of the "compressed" second frequency value for each memory cell of the display memory 2 to the corresponding first frequency value in the corresponding memory cell of the display memory 2 an update cycle is finished.

Figure 2:
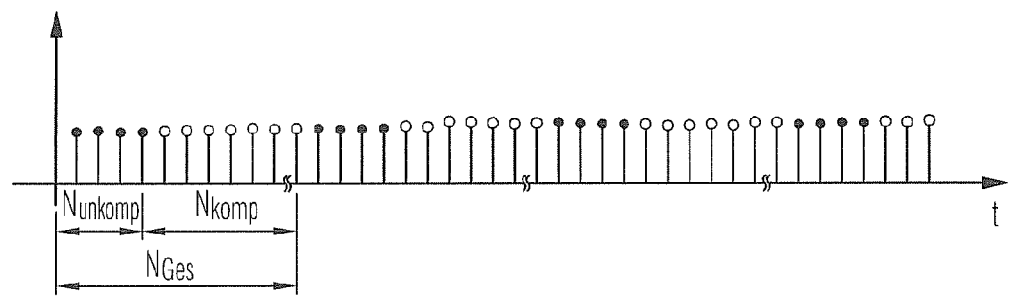

The $N_{komp}$ consecutive second measuring portions of the measured signal succeed the $N_{unkomp}$ consecutive first measuring portions of the measured values within one update cycle according to FIG. 2. In FIG. 2 the samples with filled circles characterizes samples in a first measuring portion, whereas the samples with unfilled circles characterizes samples in a second measuring portion. The arrangement of the $N_{unkomp}$ consecutive first measuring portions and of the $N_{komp}$ consecutive second measuring portions repeats cyclically in each of the following update cycles.

A first frequency value for each memory cell of the display memory 2 can be determined in one of the consecutive first measuring portions of the measured signal, if sampled values of a measured signal are acquisitioned in a number $N_{Count}$ of first measuring portions counted since the start of the actual update cycle and the counted number $N_{Count}$ of first measuring portions does not reach the value according to equation (13). The value according to equation (13) designates the number of first measuring portions assigned for the determination of first frequency values within one update cycle.

In the following method step S40 the summed frequency value stored in each memory cell of the display memory 2, which is determined from the sum of the first frequency value and of the at least one second frequency value, is displayed in a corresponding brightness or in a corresponding color in the pixel of the display 4 corresponding to the memory cell of the display memory 2 after one update cycle time. All the memory cells in the display memory 2 and in the memory in the means 3 for determining frequency values are reset for a determination of new frequency values in a new update cycle.

In the following method step S50 the total number $N_{Ges}$ of measuring portions of the measured signal within one update cycle, the number $N_{unkomp}$ of first measuring portions of the measured signal within one update cycle, the number $N_{komp}$ of second measuring portions of the measured signal within one update cycle and the compression factor and $P_{Kompres}$ are determined for the next update cycle.

In case of an unchanged number $N_{Ges}$ of measuring portions of the measured signal per update cycle from the actual update cycle to the next update cycle, the number $N_{unkomp}$ of first measuring portions of the measured signal is increased in the next update cycle, if the determined maximum first frequency value of the first frequency values in all memory cells of the display memory 2 is smaller than the number of the actual first measuring portions. The number of first measuring portions in the actual update cycle corresponds to the number of bits in each cell of the display memory assigned for storing a maximum occurring first frequency value.

In this case the new increased number $N_{unkomp\_neu\_Inc}$ of first measuring portions of the measured signal in the next update cycle is determined according to equation (4) in combination with equation (5). For avoiding an overflow in the memory cell in case of statistical deviation of the sampled values of the measured signal, the new determined number $N_{unkomp\_neu\_Inc}$ of first measuring portions of the measured signal has to be reduced by an appropriately selected tolerance value $\Delta_{unkomp\_neu}$.

The corresponding new number $N_{komp\_neu\_Inc}$ of second measuring portions of the measured signal in the next update cycle is determined according to equation (6) and the corresponding new compression factor $P_{Kompres\_Neu\_Inc}$ for the compression of each "uncompressed" second frequency value is determined according to equation (7).

The number of the first measuring portions is decreased, if the determined maximum first frequency value of the first frequency values in all memory cells of the display memory 2 reaches a limit value $N_{First\_Limit}$ according to equation (8). In equation (8) a value 10 is used representing a compression of the "uncompressed" second frequency values with an optimal quotient $$\frac{N_{komp}}{P_{Kompres}}$$

according to equation (3). Instead of an optimal value of 10 an alternative value x can be used for the quotient $$\frac{N_{komp}}{P_{Kompres}}$$

and thus has to be inserted in equation (8) instead of the value 10.

In this case, the number of first frequency measuring portions of the measured signal already treated within the actual update cycle is frozen as new decreased number $N_{unkmp\_neu\_Dec}$ of first measuring portions of the measured signal for the next update cycle. The remaining first frequency measuring portions of the measured signal of the update cycle are not considered anymore for the determination of the actual first frequency values and instead are taken into account in the determination of the actual second frequency values.

The corresponding new number $N_{kmp\_neu\_Dec}$ of second measuring portions of the measured signal in the next update cycle is determined according to equation (9) and the corresponding new compression factor $P_{Kompres\_neu\_Dec}$ for the compression of each "uncompressed" second frequency value is determined according to equation (10).

The increase in the new number $N_{kmp\_neu\_Dec}$ of second measuring portions of the measured signal can perhaps lead to a new compression factor $P_{Kompres\_neu\_Dec}$ having a fractional part according to equation (10). In this case 9 compressions of the optimal 10 compressions—or x−1 compressions in case of another selected value x for the quotient $$\frac{N_{komp}}{P_{Kompres}}$$

—are performed with the integer part of the determined new compression factor $P_{Kompres\_neu\_Dec}$ and the last compression is performed with a new compression factor $P_{Kompres\_neu\_Dec}$ having an increased value in comparison to the new compression factor $P_{Kompres\_neu\_Dec}$ according to equation (10). Thus the number of compressions for the compression of the at least one uncompressed second frequency values to the corresponding at least one compressed second frequency values—i.e. optimally the value 10 or another selected value x for the quotient $$\frac{N_{komp\_neu\_Dec}}{P_{Kompres\_neu\_Dec}}$$

—remains constant.

In case of a changing total number $N_{Ges}$ of measuring portions of the measured signal from the actual update cycle to the next update cycle following modifications of the parameters $$\frac{N_{komp}}{P_{Kompres}}$$

and $P_{Kompres}$ have to be performed in the actual update cycle and in the next update cycle.

In case of an increase of the total number $N_{Ges}$ of measuring portions of the measured signal more than $P_{Kompres}$ second measuring portions of the measured signal—i.e. $P_{Kompres}$ second measuring portions plus the difference between the total number $N_{Ges\_Akt}$ of measuring portions in the actual update cycle and the total number $N_{Ges\_Letzt}$ of measuring portions in the last update cycle—are taken into account in the last compression with the compression factor $P_{Kompres}$. In the next update cycle the compression factor $P_{Kompres}$ is incremented according to equation (11).

Alternatively the number $N_{unkomp}$ of first measuring portions of the measured signal can be increased by a comparable amount for avoiding an increase of the number of second measuring portions of the measured signal in the last compression with the compression factor $P_{Kompres}$ in the actual update cycle.

In case of a decrease of the total number $N_{Ges}$ of measuring portions of the measured signal less than $P_{Kompres}$ second measuring portions of the measured signal—i.e. $P_{Kompres}$ second measuring portions minus the difference between the total number $N_{Ges\_Letzt}$ of measuring portions in the last update cycle and the total number $N_{Ges\_Akt}$ of measuring portions in the actual update cycle—are taken into account in the last compression or in the last compressions with the compression factor $P_{Kompres}$ in the actual update cycle. In the next update cycle the compression factor $P_{Kompres}$ is decremented according to equation (12).

Alternatively the number $N_{unkomp}$ of first measuring portions of the measured signal can be decreased by a comparable amount for avoiding a decrease of the number of second measuring portions of the measured signal in the last compression with the compression factor $P_{Kompres}$ in the actual update cycle.

An increase or a decrease of the number of second measuring portions of the measured signal in the last compression with the compression factor $P_{Kompres}$ can be ignored, if the increase or the decrease is beyond a specified upper limit value. Multiple deviations of the number of second measuring portions of the measured signal taking into account the last compression can thus be minimized.

The next method step S60 determines, if the operation of the inventive measuring device 1 is finished by the user. In this case the inventive method ends. In the other case in a new update cycle a first frequency value for each memory cell of the display memory 2 is determined in the reused method step S20 and at least one second frequency value for each memory cell of the display memory 2 is determined in the reused method step S30.

Figure 6B:
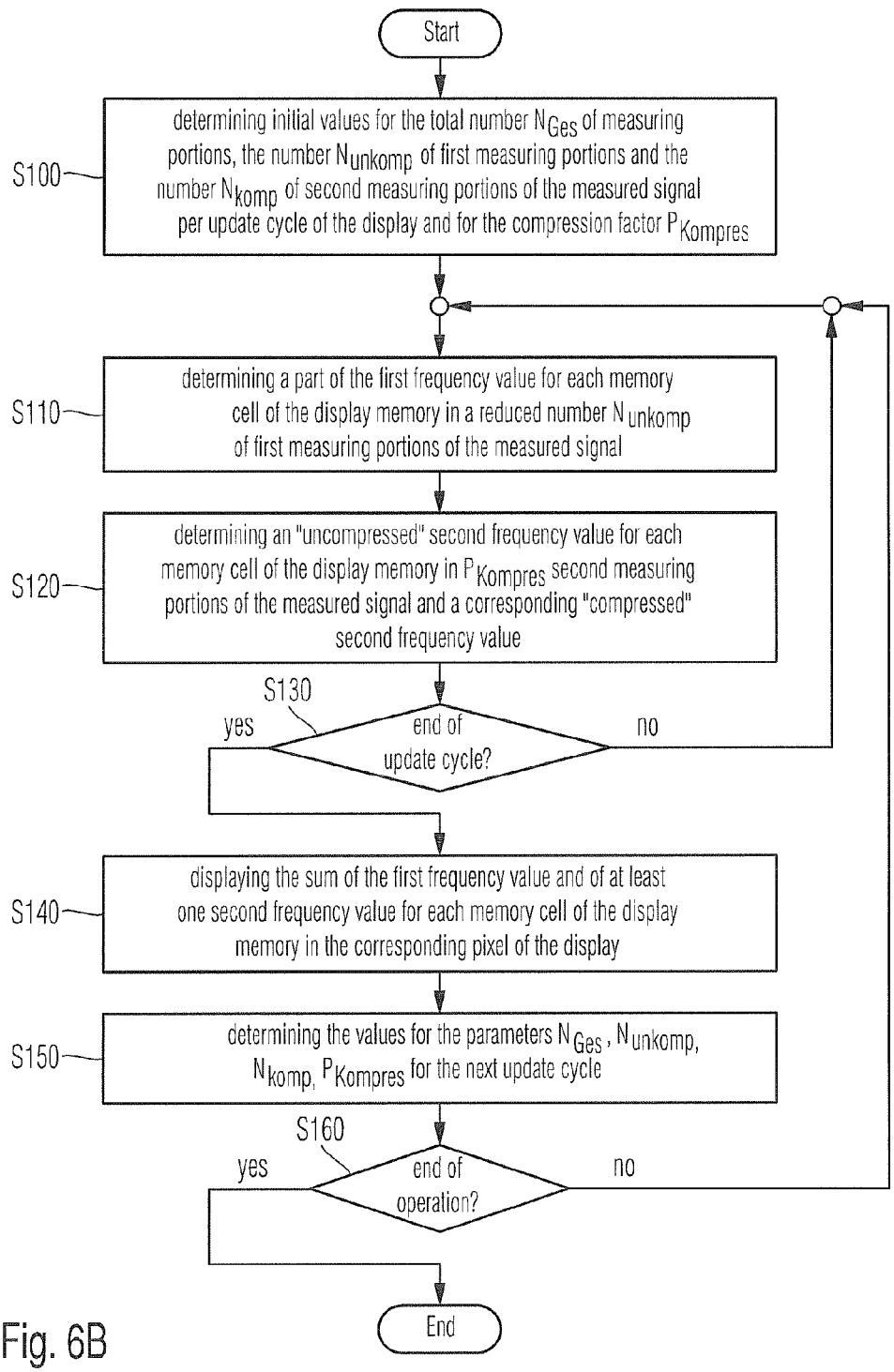

The second embodiment of the inventive method shown in the flowchart of FIG. 6B contains the method step S100, which is identical to the method step S10 of the first embodiment, and the method steps S140 to S160, which are identical to the method steps S40 to S60 of the first embodiment. These are not explained any more.

The method step S110 comprises only a reduced number $\tilde{N}_{unkomp}$ of the in total $N_{unkomp}$ first measuring portions of the measured signal within one update cycle according to equation (14) for determining a part of the first frequency value for each memory cell of the display memory 2.

In the next method step S120 only one "uncompressed" second frequency value for each memory cell of the display memory 2 is determined in $P_{Kompres}$ consecutive second measuring portions of the measured signal by incrementation of a corresponding memory cell of a memory in the means 3 for determining frequency values, which is not shown in FIG. 5. In the same method step S120 a "compressed" second frequency value for each memory cell is determined by compression of the corresponding "uncompressed" second frequency value with the compression factor $P_{Kompres}$. The "compressed" second frequency value for each memory cell is summed to the already determined part of the first frequency value in the corresponding memory cell of the display memory 2.

If method step S130 determines that all measuring portions of the measured signal within one update cycle are not yet treated, the method step S110 in sequence with the method step S120 is cyclically repeated $$\frac{N_{komp}}{P_{Kompres}} - 1 = 10 - 1 = 9$$

times in total. Optionally another value x for the quotient $$\frac{N_{komp}}{P_{Kompres}}$$

instead of the value 10 can be selected and is thus within the scope of the invention.

In each repetition of method steps S110 and S120 a part of the first frequency value and a "compressed" second frequency value for each memory cell is summed to the already determined parts of the first frequency value and the already determined second frequency values both being already stored in the corresponding memory cell for determining the total frequency value for each memory cell in the actual update cycle.

If method step S130 determines that all measuring portions of the measured signal within one update cycle are treated, the display of the total frequency value in each memory cell of the display memory 2 in the corresponding pixel of the display 3 is performed in the next method step S140.

Figure 3:
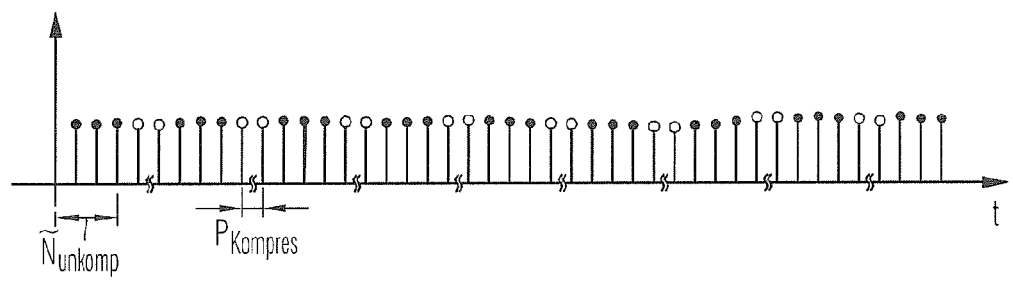

FIG. 3 shows the reduced number $\tilde{N}_{unkomp}$ of consecutive first measuring portions of the measured signal for determining a part of the first frequency value within one update cyclically succeeded by the $P_{Kompres}$ consecutive second measuring portions of the measured signal for determining one "uncompressed" second frequency value resp. one "compressed" second frequency value.

The better distribution of the first measuring portions over the update cycle in the second embodiment in comparison to the first embodiment results in a more realistic image of the statistical distribution of the sampled values of the measured signal in the display in case of time variant signal characteristics.

Figure 6C:
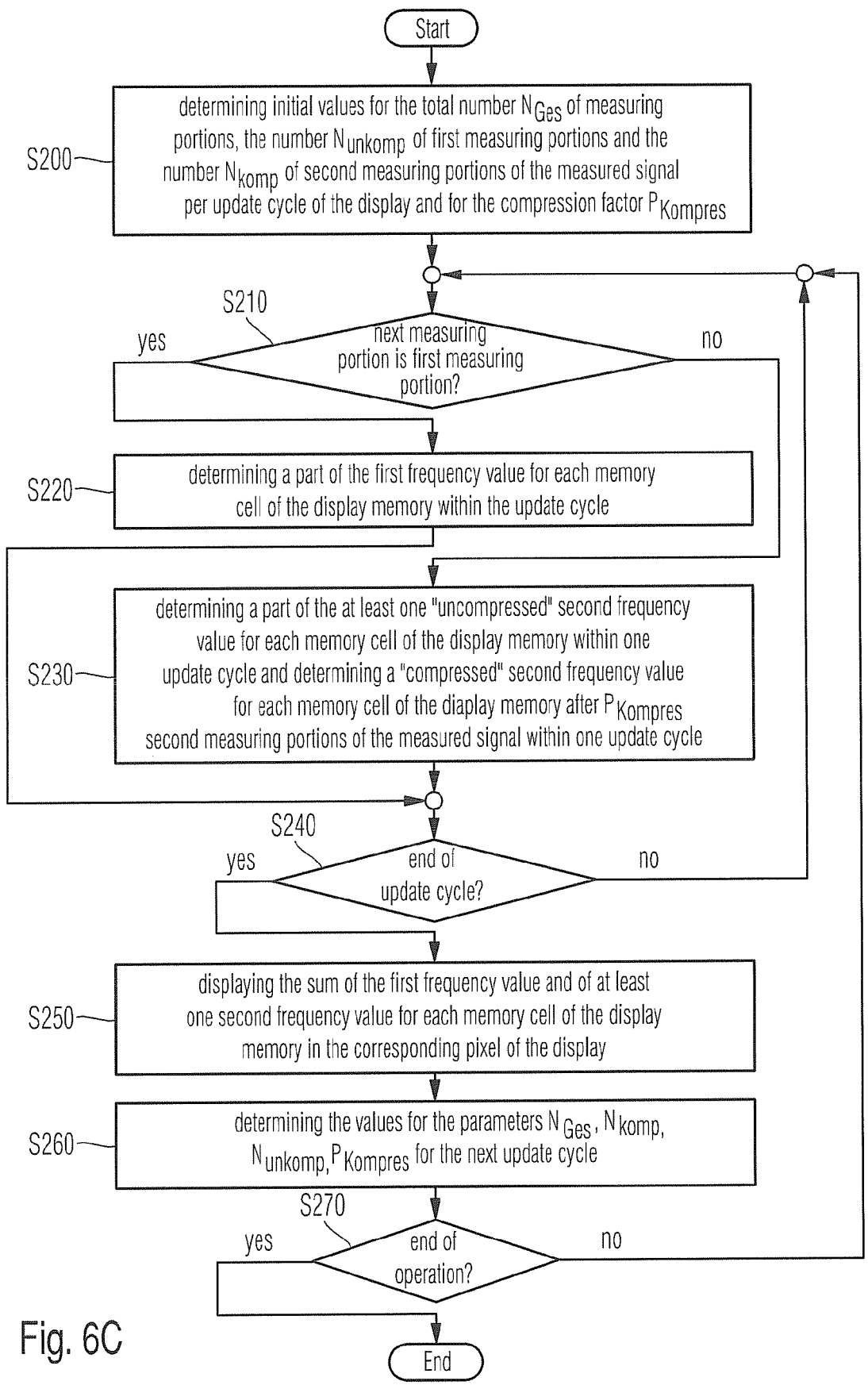

The third embodiment of the inventive method in the flowchart of FIG. 6C contains the method step S200, which is identical to the method step S10 of the first embodiment, and the method steps S250 to S270, which are identical to the method steps S40 to S60 of the first embodiment. These are not explained any more.

Method step S210 determines, if the next measuring portion of the measured signal is a first measuring portion.

In case of a first measuring portion of the measured signal in the next method step S220 a part of the first frequency value for each memory cell of the display memory is determined in the first measuring portion and stored in the corresponding memory cell of the display memory 2.

Alternatively, in the next method step S230 a part of at least one second frequency value for each memory cell of the display memory is determined in the second measuring portion and is stored in the corresponding memory cell of the compression memory in the first inventive variant. If at least a part of a second frequency value is already stored in a memory cell of the compression memory—determined in a formerly performed method step S230—the newly determined part of the second frequency value is added to the already stored part of the second frequency value.

In the same method step S230 a counter within the means 3 for determining frequency values which is not shown in FIG. 5 counts the number of second measuring portions of the measured signal which are already treated within the actual update cycle. If the counter reaches the value $P_{Kompres}$, each "compressed" second frequency value is determined from the "uncompressed" second frequency value in each memory cell of the compression memory in the first inventive variant. Each "compressed" second frequency value is transferred from the compression memory to the display memory 2 and is summed to the already determined part of the corresponding first frequency value. Afterwards the counter and each memory cell in the compression memory are reset for a new compression phase.

In the second inventive variant each determined second frequency value being one results in an increase of the content in the corresponding memory cell of the compression memory to a value one, if the already stored content in that memory cell has the value zero. The content of that memory cell having already stored a value one remains one, if a second frequency value of one is determined for that memory cell in a first portion of the measured signal.

If the counter reaches in the second inventive variant the value $P_{Kompres}$ the already "compressed" second frequency values in all the memory cells of the compression memory are transferred from the compression memory to the display memory 2 and are summed to the already determined part of the corresponding first frequency value. Afterwards the counter and each memory cell in the compression memory are reset for a new compression phase.

In the third inventive variant each determined second frequency value being one results in an increase of the content in the corresponding memory cell of the display memory 2 to a value one, if the corresponding memory cell of the compression memory indicates a value zero in the corresponding memory cell of the display memory 2. If the corresponding memory cell of the compression memory indicates a value one in the corresponding memory cell of the display memory 2, the content in the corresponding memory cell in the display memory 2 remains one in case of a determined second frequency value of one for that memory cell in the display memory 2.

If the counter reaches in the third inventive variant the value $P_{Kompres}$, all the bits in the bit map in the compression memory and the counter are reset for a new compression phase.

The next method step S240 determines, if all measuring portions of the actual update cycle are already treated.

If all measuring portions of the measured signal within the actual update cycle are not yet treated, the next performed method step S210 determines, if the next measuring portion is a first measuring portion of the measured signal.

In case of a first measuring portion a next part of the first frequency value for each memory cell of the display memory 2 is determined in the first measuring portion of the measured signal and is summed to the already determined frequency value in the corresponding memory cell in the next method step S220, whereas in case of a second measuring portion a next part of at least one second frequency value for each memory cell of the display memory 2 is determined in the second measuring portion of the measured signal and is summed to the already determined frequency value in the corresponding memory cell in the next method step S230.

If all measuring portions of the measured signal within the actual update cycle are treated, the frequency values in all memory cells of the display memory 2 are displayed in the corresponding pixels of the display 3 in the following method step S250.

Figure 4:
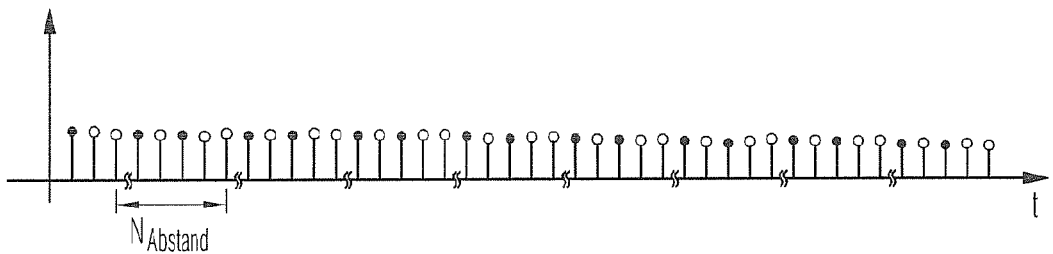

In the third embodiment of the inventive method the "compressed" second frequency value for each memory cell of the display memory 2 is performed in an equal distance of $N_{Abstand}$ measuring portions of the measured signal as shown in FIG. 4. Both all the reduced number $\tilde{N}_{unkomp}$ of first measuring portions of the measured signal, in which a part of the first frequency value is determined, and all the $P_{Kompres}$ second measuring portions of the measured signal, in which one "uncompressed" second frequency value and consequently after compression with the compression factor $P_{Kompres}$ one "compressed" second frequency is determined, can be positioned totally disordered as shown in FIG. 4. However, the equal distance between the determinations of each "compressed" second frequency value corresponds to $N_{Abstand}$ measuring portions according to equation (15).

The better distribution of the first measuring portions over the update cycle also in the third embodiment in comparison to the first embodiment results in a more realistic image of the statistical distribution of the sampled values of the measured signal in the display in case of time variant signal characteristics.

The inventive method and the corresponding inventive measurement device can be used in a so called point-mode, in which the frequency value stored in a memory cell for a display in a corresponding pixel of the display is treated separately.

In the so called line-mode a simultaneous incrementation of the frequency values in several memory cells corresponding to pixels in a horizontal or in a vertical line in the display is performed. A method and an apparatus for avoiding an incrementation of all the memory cells from the start until the end of the line is shown in DE 10 2007 001 043 A1, in which only the incrementation of the frequency in the memory cell corresponding to the first pixel of the line and a decrementation of the frequency in the memory cell corresponding to the pixel succeeding the last pixel of the line is necessary. In the update process of the display an integration step over the content of all the memory cells corresponding to a row or to a column of the display enables the display of the incrementation in the frequency values of each pixel from the start until the end of the line.

Using the line-mode according to DE 10 2007 001 043 A1 following modifications have to be performed in the inventive method and in the corresponding inventive measurement device:

In the point-mode each "compressed" second frequency value has the status zero—in case of an "uncompressed" second frequency value of zero—or the status one—in case of an "uncompressed" second frequency value of at least one—, whereas in the line-mode each "uncompressed" or "compressed" second frequency value has an actual status zero—in case of a second frequency value determined until now without any incrementation or any decrementation—or an actual status one—in case of a second frequency value determined until now with at least one incrementation and without any decrementation—or an actual status two—in case of a second frequency value determined until now without any incrementation and with at least one decrementation—or an actual status three—in case of an "uncompressed" second frequency value determined until now with at least one incrementation and with at least one decrementation—.

Firstly, in each second measuring portion the inventive method using the line-mode identifies, in which row of the display a horizontal line between a corresponding first pixel and a corresponding last pixel and in which column of the display a vertical line between a corresponding first pixel and a corresponding last pixel occurs.

Secondly, a line is taken into the account in the memory cell of the display memory 2 corresponding to the first pixel and in the memory cell of the display memory 2 corresponding to the pixel succeeding the last pixel of a line identified in a measuring portion, if the memory cell corresponding to the first pixel of the identified line does not contain any increments (status of the "uncompressed" or "compressed" second frequency value is zero or two) and if the memory cell corresponding to the pixel succeeding the last pixel of the identified line does not contain any decrements within the actual compression (status of the "uncompressed" or "compressed" second frequency value is zero or one).

Thus the status of "uncompressed" or "compressed" second frequency value in the memory cell corresponding to the first pixel of the identified line is changed from zero to one resp. from two to three. The status of "uncompressed" or "compressed" second frequency value in the memory cell corresponding to the pixel succeeding the first pixel of the identified line is changed from zero to two resp. from one to three.

Alternatively, a line is not taken into the account in the memory cell corresponding to the first pixel and in the memory cell corresponding to the pixel succeeding the last pixel of a line identified in a measuring portion, if both the memory cell corresponding to the first pixel of the identified line contains at least one increment (status of the "uncompressed" or "compressed" second frequency value is one or three) and the memory cell corresponding to the pixel succeeding the last pixel of the identified line contain at least one decrement within the actual compression (status of the "uncompressed" or "compressed" second frequency value is zero or one).

In this manner each spike is taken into account in the "compressed" second frequency value of the memory cells corresponding to the first pixel of the identified line and in the memory cells corresponding to the pixel succeeding the last pixel of the identified line, if the memory cell corresponding to the first pixel of the identified line was not yet any start pixel of an identified line and the memory cell corresponding to the pixel succeeding the last pixel of the identified line was not yet any end pixel an identified line within the actual compression.

In the line-mode the parameters $N_{Ges}$, $N_{unkomp}$, $N_{komp}$, $P_{Kompres}$ can be adaptively determined equivalently to the point-mode.

Preferably the compression factor $P_{Kompres}$ is identical for the compression of the at least one second frequency value.

Further, preferably the number $N_{unkomp}$ of first measuring portions corresponds to the first frequency value of the first frequency values in all memory cells, which reaches firstly the value two, which is powered with the reduced number of bits $N_{Bits}$, minus the value one, minus the number $$\frac{Reclength}{N_{Col}}$$

of sampled values in all memory cells of a column in the display 4 within one update cycle and minus an integer quotient $$\frac{N_{komp}}{P_{Kompres}}$$

between the number $N_{komp}$ of the second measuring portions and the compression factor $P_{Kompres}$, whereby Reclength is the number of sampled values in a measuring portion and $N_{Col}$ is the number of columns in the display 4.

Further, preferably the reduced number $\tilde{N}_{unkomp}$ of consecutive first measuring portions of the measured signal corresponds to the quotient between the number $N_{unkomp}$ of all first measuring portions within an update cycle and the number $$\frac{N_{komp}}{P_{Kompres}}$$

of compressed second frequency values within an update cycle.

Further, preferably an increased number $N_{unkomp\_neu\_Inc}$ of the first measuring portions corresponds to the number $N_{unkomp}$ of the first measuring portions in the actual update cycle multiplied by the quotient between the number $N_{unkomp}$ of the first measuring portions in the actual update cycle and the determined maximum first frequency value $N_{First\_Max}$ of the first frequency values in all memory cells.

Further, preferably the limit value $N_{First\_Limit}$ corresponds to the value two, which is powered with the reduced number of bits $N_{Bits}$, minus the number $$\frac{Reclength}{N_{Col}}$$

of sampled values in all memory cells in a column of the display 4 within an update cycle minus the number $$\frac{N_{komp}}{P_{Kompres}}$$

of compressed second frequency values within an update cycle.

Further, preferably a decreased number $N_{unkmp\_neu\_Dec}$ of the first measuring portions corresponds to the determined maximum first frequency value $N_{First\_Max}$ of the first frequency values in all memory cells, which reaches the limit value $N_{First\_Limit}$.

Further, preferably the number of second measuring portions for determining a second frequency value in the latest compression with the compression factor $P_{Kompres}$ within the actual update cycle is increased for realizing a constant number $$\frac{N_{komp}}{P_{Kompres}}$$

of compressed second frequency values in all the update cycles.

Further, preferably the compression factor $P_{Kompres}$ is increased in the next update cycle for realizing a constant number of compressed second frequency values in all the update cycles.

Further, preferably the second frequency values for each memory cell are determined in the decreased number of second measuring portions within the actual update cycle.

Further, preferably the compression factor $P_{Kompres}$ is decreased in the next update cycle for realizing a constant number $$\frac{N_{komp}}{P_{Kompres}}$$

of compressed second frequency values in all the update cycles.

The invention is not limited to the described embodiments. Especially, the use of a dynamically increasing compression factor, which increases with the number of already treated "uncompressed" second frequency values within one update cycle, is within the scope of the invention. Additionally, the scope of the invention comprises all combinations of the all features claimed in the claims, all the features disclosed in the description and all the features shown in the figures of the drawings. Each feature of the method claims can also be a feature of the device claims.

What is claimed:

1. A method for reducing a number of bits used for a frequency value of a measuring signal stored in each memory cell of a display memory in a measuring device, the method comprising the following steps:
   determining the frequency value in each memory cell by assigning the frequency of sampled values in several measuring portions of a measured signal within an update cycle of the display to a corresponding memory cell; and
   displaying each pixel of the display with a brightness or a color corresponding to the frequency value in the corresponding memory cell after each update cycle,
   wherein the determined frequency value is a sum of a first frequency value, which is determined in a number of first measuring portions of the measured signal within the update cycle, and at least one compressed second frequency value, which is determined by compression of a corresponding uncompressed second frequency value with a compression factor and each frequency value stored in the memory cell for display in a corresponding pixel of the display is treated separately.

2. The method according to claim 1,
   wherein each uncompressed second frequency value is determined in a corresponding part of a number of second measuring portions of the measured signal within the update cycle.

3. The method according to claim 1,
   wherein the number of second measuring portions for determining each uncompressed second frequency value corresponds to the compression factor.

4. The method according to claim 2,
   wherein the determination of the first frequency value in each memory cell is performed in all consecutive first measuring portions of the measured signal, which are disposed cyclically with all consecutive second measuring portions of the measured signal, in which the determination of all the at least one uncompressed second frequency value is performed.

5. The method according to claim 1,
   wherein the number of second measuring portions for determining an uncompressed second frequency value for each memory cell corresponds to the compression factor and is cyclically succeeded by a reduced number of consecutive first measuring portions of the measured signal, in which a part of the first frequency value for each memory cell is determined.

6. The method according to claim 1,
   wherein a reduced number of consecutive first measuring portions of the measured signal, in which a part of the first frequency value for each memory cell is determined, is equally distributed between the number of second measuring portions for determining an uncompressed second frequency value for each memory cell within one update cycle, which corresponds to the compression factor.

7. The method according to claim 1,
   wherein the number of the first measuring portions and the number of the second measuring portions within an update cycle is determined cyclically after at least one update cycle.

8. The method according to claim 7,
   wherein the number of the first measuring portions is increased, if the determined maximum first frequency value of the first frequency values in all memory cells is smaller than the number of the first measuring portions in an actual update cycle.

9. The method according to claim 7,
wherein the number of the first measuring portions is decreased, if the determined maximum first frequency value of the first frequency values in all memory cells is equal to or larger than a limit value.

10. The method according to claim 9,
wherein if the number of compressed second frequency values within an update cycle results in an integer value plus a fractional value, the compression factor and the number of the second measuring portions to be compressed in the latest compression within one update cycle are increased equally for realizing a fractional value of zero.

11. The method according to claim 1,
wherein if the number of measuring portions within an update cycle increases, the number of first measuring portions remains constant in the actual update cycle and in a next update cycle and the number of second measuring portions increases in the actual update cycle.

12. The method according to claim 1,
wherein if the number of measuring portions within an update cycle decreases, the number of first measuring portions remains constant in the actual update cycle and in a next update cycles and the number of second measuring portions increases in the actual update cycle.

* * * * *